(12) United States Patent
Kim et al.

(10) Patent No.: US 6,641,974 B2
(45) Date of Patent: Nov. 4, 2003

(54) CHEMICALLY AMPLIFIED RESIST COMPOSITION CONTAINING LOW MOLECULAR WEIGHT ADDITIVES

(75) Inventors: Jae Young Kim, Taejeon (KR); Joo Hyeon Park, Taejeon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 13 days.

(21) Appl. No.: 09/759,825

(22) Filed: Jan. 12, 2001

(65) Prior Publication Data

US 2001/0041302 A1 Nov. 15, 2001

(30) Foreign Application Priority Data

Feb. 16, 2000 (KR) .............................. 00-7272

(51) Int. Cl.$^7$ ..................... G03F 7/039; G03F 7/004
(52) U.S. Cl. ................... 430/270.1; 430/905; 526/272; 526/281
(58) Field of Search .............................. 430/270.1, 905; 526/272, 281

(56) References Cited

U.S. PATENT DOCUMENTS

| 5,585,223 | A | * | 12/1996 | Frechet et al. .............. 430/296 |
| 6,103,450 | A | * | 8/2000 | Choi ........................ 430/270.1 |
| 6,143,466 | A | * | 11/2000 | Choi ........................ 430/270.1 |
| 6,146,810 | A | * | 11/2000 | Seo et al. ................ 430/270.1 |
| 6,286,106 | B1 | * | 7/2001 | Park et al. ............... 430/270.1 |
| 6,358,666 | B1 | * | 3/2002 | Seo et al. ................ 430/270.1 |

FOREIGN PATENT DOCUMENTS

| JP | 11002903 A | * | 1/1999 | ........... G03F/7/039 |
| JP | 11184089 A | * | 7/1999 | ........... G03F/7/039 |

* cited by examiner

*Primary Examiner*—Janet Baxter
*Assistant Examiner*—Yvette M. Clarke
(74) *Attorney, Agent, or Firm*—Davidson, Davidson & Kappel, LLC

(57) ABSTRACT

Disclosed is a chemically amplified positive photoresist composition including a multi-component copolymer having a polystyrene-reduced weight average molecular weight (Mw) of 3,000 to 50,000 and a molecular weight distribution (Mw/Mn) of 1.0 to 3.0, a low molecular weight additive, an acid generator, and a solvent.

A resist composition comprising the additive may provide a resist pattern excellent in sensitivity as well as adhesion to substrate and dry etching resistance. Such a resist composition is a promising material greatly suitable for use in the fabrication of semiconductor devices that are expected to have further fineness. Especially, the resist composition is suitable for KrF or ArF excimer laser lithography and thus useful in the fine engineering of less than 0.20 micron patterns.

3 Claims, No Drawings

US 6,641,974 B2

CHEMICALLY AMPLIFIED RESIST COMPOSITION CONTAINING LOW MOLECULAR WEIGHT ADDITIVES

BACKGROUND OF THE INVENTION

1. Field of the Invention

The present invention relates to a chemically amplified resist composition useful for a micro-engineering process using various radiations including far ultraviolet ray (e.g., KrF excimer laser and ArF excimer laser), X-ray (e.g., synchrotron radiation) and charged particle beams (e.g. electron beam) and, more particularly, to a chemically amplified resist composition comprising (A) a polymer for resist having an acid labile group, (B) a photoacid generator, and (C) a low molecular weight additive for increasing dry etching resistance and resolution of the pattern.

2. Description of the Related Art

In the fabrication of semiconductor devices, a resist is applied on a substrate such as silicon wafer to form a coating and exposed to radiations to form a pattern, after which the resist is developed to form a positive or negative pattern, i.e., an image is created by lithography.

As the LSI and VLSI technologies in the fabrication of semiconductor integrated circuits tend toward higher integration, higher density, miniaturization and higher speed, a rule of submicron (less than 0.2 micron) is required for the fineness of pattern. Accordingly, the lithography light sources are shifting towards shorter wavelength from the existing g- or i-line band and there is an increasing interest in the lithography using far UV radiations, KrF or ArF excimer laser, X-ray or electron beams.

Near UV radiations including i-line have been mainly used in the existing lithography process but are known insufficient to form sub-quarter (0.25) micron patterns. For the formation of sub-quarter micron patterns, the attention is focused on radiation sources in the shorter wavelength band including far UV radiations such as excimer lasers, X-ray and electron beams, and particularly KrF or ArF excimer laser.

Resist compositions suitable for the excimer laser lithography comprise a polymer component having an acid labile group, a component generating an acid upon irradiation with a radiation (hereinafter, referred to as "photoacid generator"), and a solvent. Such resists comprising the resist compositions undergo chemical amplification due to the photoacid generator in the lithography and will be hereinafter referred to as "chemically amplified resist".

For example, chemically amplified resist compositions containing a polymer having a ter-butyl ester group of carboxylic acid or a ter-butylcarbonyl group of phenol, and a photoacid generator are disclosed in Japanese Patent Application Kokoku No. 2-27,660. These resist compositions have such an advantage that the catalytic action of the acid generated under irradiation of a radiation causes the tert-butyl ester group or tert-butylcarbonyl group of the polymer decomposed to leave a hydroxyl group, which makes the exposed area of the resist very soluble in an alkaline developing solution.

However, chemically amplified resists used in the KrF excimer laser lithography are mostly composed of a phenol resin as a base material containing aromatic rings and unsuitable for use in the ArF excimer laser because the aromatic rings in the phenol resin absorb lots of the ArF excimer laser. In an attempt to overcome this problem, many studies have been made on polyacrylate derivatives as a matrix resin having less absorption of the ArF excimer laser than the phenol resin (See. Japanese Patent Laid-Open Kokoku No. 4-226,461, Proc. SPIE, 1996, vol. 2724, p. 377).

Polyacrylate absorbs less radiation having a wavelength falling within the ArF excimer laser region but is adversely inferior in the dry etching resistance. To solve this problem, there have recently been made many studied on the method for improving the etching resistance of the resist with an alicyclic derivative introduced to the side chain of the polyacrylate, in which case the hydrophobic property of the alicyclic derivative deteriorates the affinity to the developing solution. The adhesion between the resist and the substrate is an important factor in formation of less than 0.2 micron patterns. So, the existing polyacrylate matrix resin contains a carboxylic acid at the side chain in order to enhance the adhesion to the substrate (See. Proc. SPIE, 1997, vol. 3049, p. 126). However, an excess of the carboxylic acid increases the solubility of the polyacrylate resin in the alkaline aqueous solution and causes a need of varying the concentration of the alkaline developing solution.

An example of matrix resin that has improved dry etching resistance and hydrophilic property may include a copolymer of anhydrous maleic acid and olefin (See. Proc. SPIE, 1997, vol. 3049, p. 92). The anhydrous maleic acid possesses the hydrophilic property and acts as a promoter enabling copolymerization with the olefin monomer at low temperature and low pressure. Also, the olefin monomer may contain various substituents at the side chain to enhance dry etching resistance and resolution (See. Proc. SPIE, 1998, vol. 3333, p. 463).

Recently, low molecular weight additives for use in the resist composition containing a copolymer resin of anhydrous maleic acid and olefin monomers are being watched with keen interest so as to improve the residual coating property, increase dry etching resistance and reduce refining effect in the formation of patterns (Korean Patent Laid-Open No. 98-064842; and Proc. SPIE, 1998, vol. 3333, p. 73).

SUMMARY OF THE INVENTION

It is, therefore, an object of the present invention to provide a chemically amplified photoresist sensitive to the far UV radiations including KrF or ArF excimer laser and, more particularly, a chemically amplified resist composition which has a high transparency to the ArF excimer laser to provide high resolution and sensitivity of the photoresist and is excellent in adhesion to the substrate, dry etching resistance and developing property due to a low molecular weight additive having a ring structure with an acid-labile acetal or ketal group.

To achieve the above object of the present invention, there is provided a chemically amplified positive photoresist composition comprising:

a multi-component copolymer represented by the formula 1 and having a polystyrene-reduced weight average molecular weight (Mw) of 3,000 to 50,000 and a molecular weight distribution (Mw/Mn) of 1.0 to 3.0;

a low molecular weight additive represented by the formula V;

an acid generator; and a solvent,

[Formula 1]

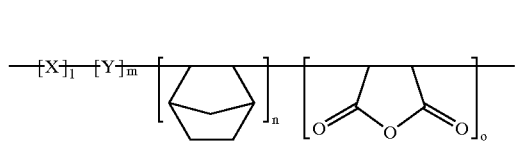

(I)

wherein X and Y independently comprise a repeating unit selected from the group consisting of monomers represented by the formulas (II), (III) and (IV):

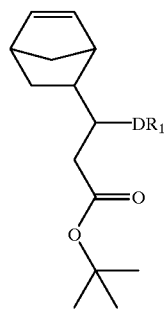

(II)

(III)

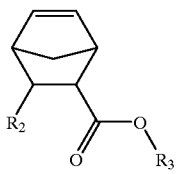

(IV)

wherein $R_1$ is a hydrogen atom, a normal, branched, monocyclic or polycyclic alkyl group having 1 to 20 carbon atoms, or a normal, branched, monocyclic or polycyclic alkyl carbonyl group having 1 to 20 carbon atoms, including acetyl group, t-butyl oxycarbonyl group, cyclohexane carbonyl group, adamanthane carbonyl group and bicyclo[2,2,1]heptane methyl carbonyl group; $R_2$ is a hydrogen atom, a hydroxyl group, a carboxyl group, an alkyl or alkoxy group having 1 to 20 carbon atoms, an alkyl or alkoxy group containing a hydroxyl or carboxyl group, a normal or branched alkyloxycarbonyl or alkoxyalkylcarbonyl group, or a monocyclic or polycyclic alkyloxycarbonyl group; $R_3$ is a hydrogen atom, or a normal, branched, monocyclic or polycyclic alkyl group having 1 to 20 carbon atoms, including methyl group, ethyl group, t-butyl group, isopropyl group, adamanthyl group, and bicyclo[2,2,1] heptane methyl group; and l, m, n and o are independently a number representing the repeating unit of the polymer and satisfying $0 \leq l/(l+m+n+o) \leq 0.5$, $0 \leq m/(l+m+n+o) \leq 0.5$, $0 \leq n/(l+m+n+o) \leq 0.35$, $0.4 \leq o/(l+m+n+o) \leq 0.6$, and $0.15 \leq (l+m)/(l+m+n+o) \leq 0.5$,

[Formula V]

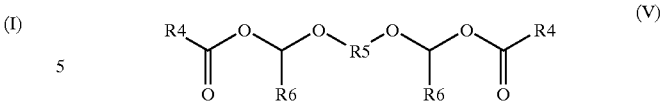

(V)

wherein $R_4$ and $R_5$ are the same as or different from each other and each represents a normal, branched, monocyclic or polycyclic alkyl group having 1 to 20 carbon atoms; and $R_6$ is a hydrogen atom, or a normal, branched, monocyclic or polycyclic alkyl or alkoxy group having 1 to 20 carbon atoms.

DETAILED DESCRIPTION OF THE PREFERRED EMBODIMENT

To improve the drawbacks of the related art chemically amplified positive resist in regard to adhesion to substrate, dry etching resistance and developing property, the invention provides a novel chemically amplified positive resist composition having a ring structure at the main chain comprising anhydrous maleic acids and norbornene derivatives to enhance dry etching resistance, a hydroxyl group as a repeating unit at the side chain to enhance adhesion to substrate, and optionally various acid-labile groups at the side chain to improve sensitivity and resolution of the resist. In particular, the chemically amplified positive resist composition further comprises a low molecular weight additive containing an acid liable group whose action enhances the dissolution-inhibiting effect on the unexposed region.

(A) Polymer

The polymer used in the present invention has a repeating unit containing an anhydrous maleic acid, and a norbornene or norbornene carboxylic acid derivative, an anhydrous norbornene carboxylic acid derivative, or a norbornene derivative having hydroxyl groups or acid labile groups attached to the side chain. Also, the polymer according to the present invention is in itself insoluble or hardly soluble in an alkaline aqueous solution and contains at least one protective group decomposable by the photoacid generator.

The alkali-solubility of the polymer can be varied depending on the content of the acid labile groups decomposable by the photoacid generator. As such, various polymers are obtained depending on the type and content of the norbornene derivative in the main chain. Using this polymer, the resist composition has excellent dry etching resistance and adhesion to substrate, as well as enhanced resolution and heat resistance.

The polymer used in the present invention is a multi-component copolymer having a repeating unit represented by the formula 1.

Monomers represented by the formulas (II), (III) and (IV) contain at least one hydroxyl group, carboxyl group or acid labile group, and a hydrophobic group having a straight or ring chain in the molecule, so that the polymer using the monomers increases the dissolution-inhibiting effect on the unexposed region of the resist with enhanced dry etching resistance.

The monomer represented by the formula (II) is 3-bicyclo[2,2,1]hept-5-en-2-yl-3-hydroxy-propionic acid-tert-butylester (hereinafter, referred to as "BHP"), or derivatives thereof. Specific examples of the monomer may include:
(II-1)
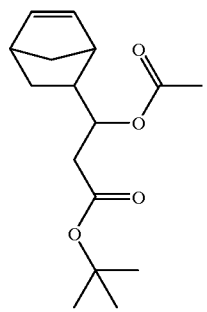
(II-2)
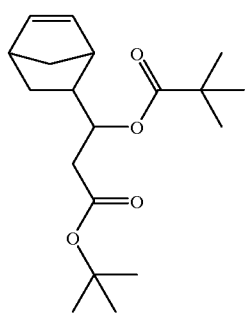
(II-3)
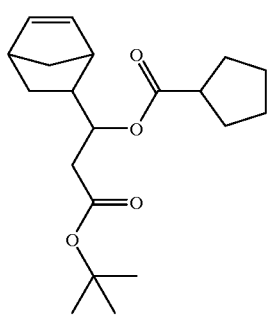
(II-4)
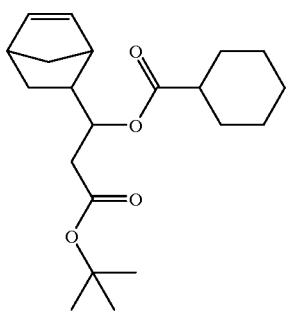
(II-5)
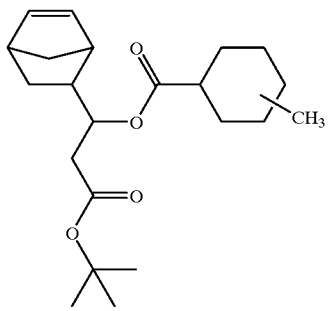
(II-6)
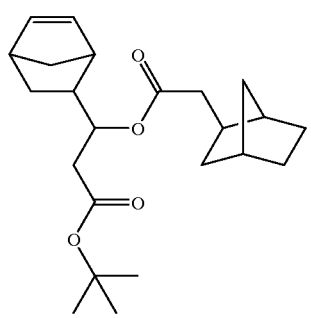
(II-7)
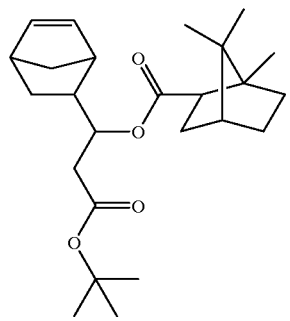
(II-8)
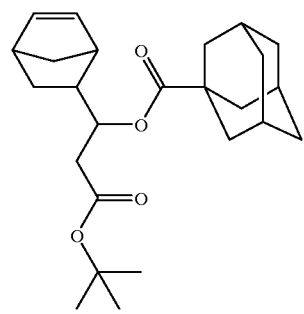

(II-9)
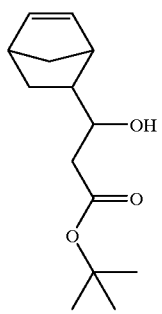
The monomer represented by the formula (III) is a norbornene carboxylic acid, or derivatives thereof, and specific examples of the monomer may include:
(III-1)
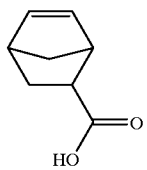
(III-2)
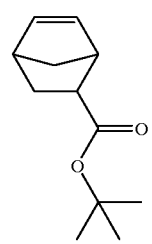
(III-3)
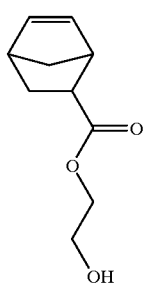
(III-4)
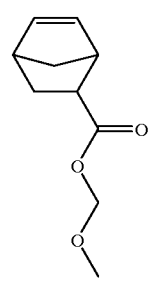
(III-5)
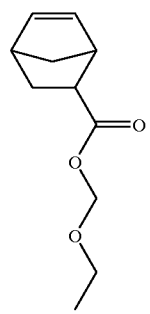
(III-6)
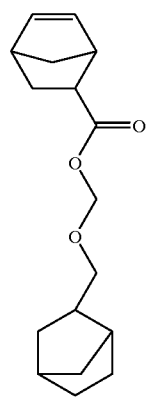
The monomer represented by the formula (IV) is an anhydrous norbornene carboxylic acid, or derivatives thereof, and specific examples of the monomer may include:
(IV-1)
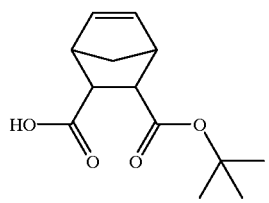
(IV-2)
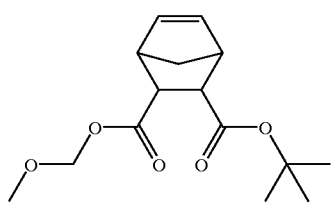
(IV-3)
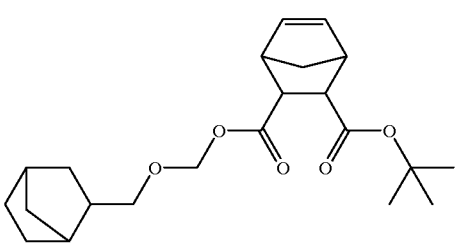

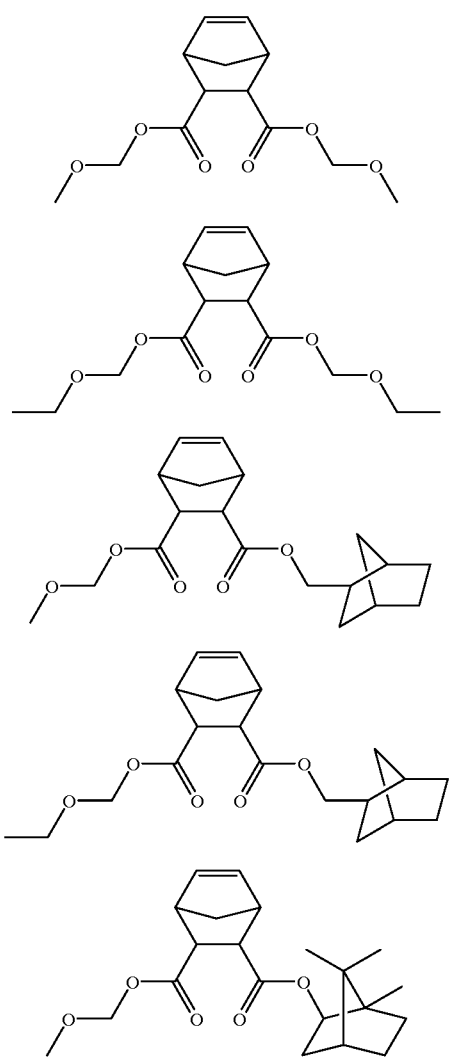
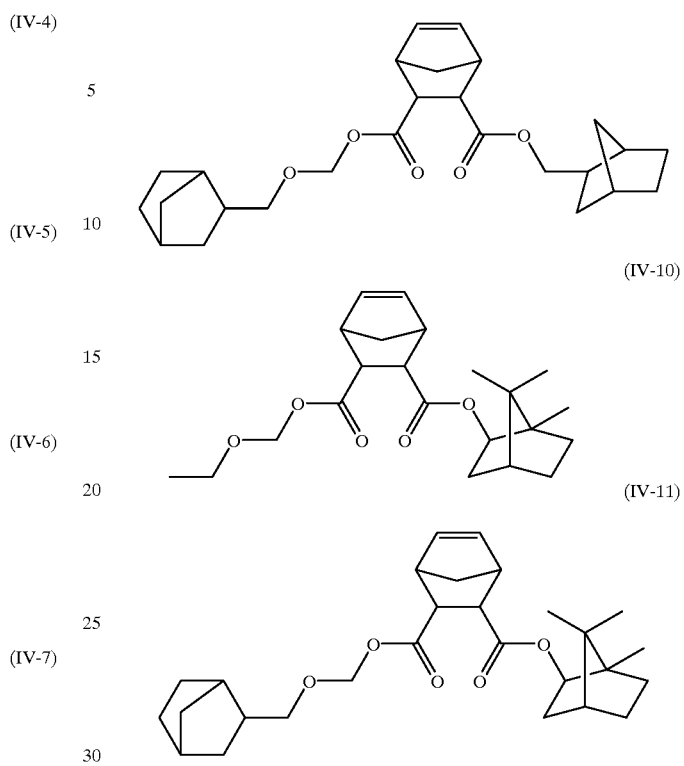

The polymer represented by the formula 1 can be prepared by multi-copolymerization of a monomer selected from the norbornene derivatives having the formulas (II), (III) and (IV), a norbornene and an anhydrous maleic acid.

In selection of the norbornene derivative X or Y in the formula 1, it is desirable that the norbornene derivative X in the formula 1 contains a hydroxyl or carboxyl group as represented by the formula (II-9), (III-3) or (IV-1) and that the norbornene derivative Y contains neither hydroxyl nor carboxylic group but has an acid labile group.

Examples of the multi-component copolymer prepared by the above-stated procedure may include the following polymers, wherein the content of the repeating unit in the resin can be property varied in consideration of sensitivity, adhesion to substrate and resolution of the resist:

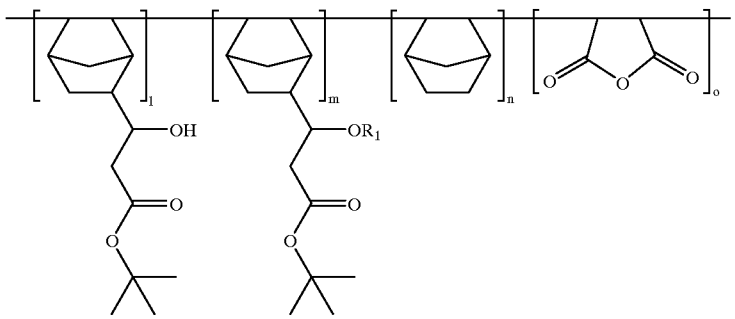

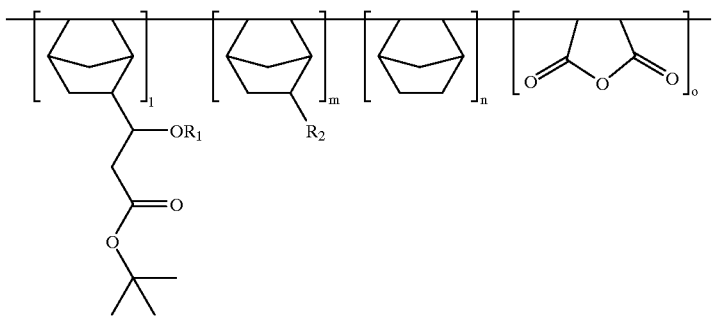
(P-2)

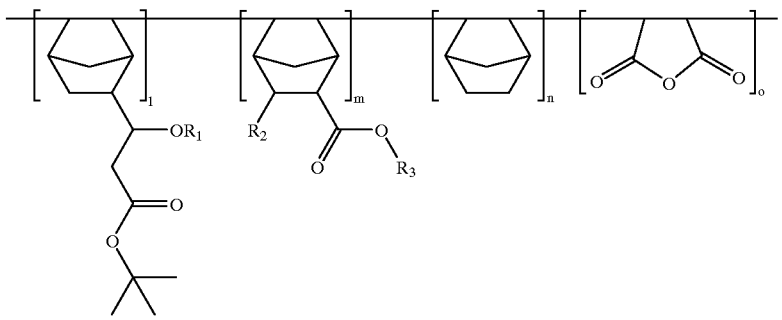
(P-3)

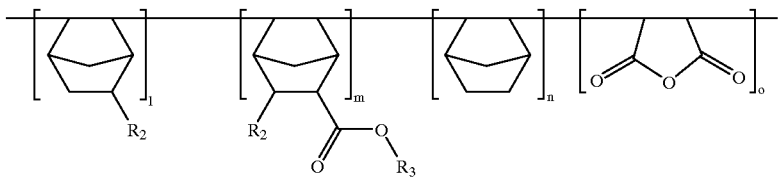
(P-4)

wherein $R_1$, $R_2$, $R_3$, l, m, n and o are as defined above.

The multi-component copolymer may include a block copolymer, a random copolymer or a graft copolymer and, preferably, an alternating copolymer or random copolymer of anhydrous maleic acids and norbornene derivatives.

The polymer represented by the formula 1 can be prepared by a known polymerization reaction and, preferably, solution polymerization using a radical polymerization initiator. Examples of the radical polymerization initiator may include, if not limited to, azo compounds such as azo-bis(isobutyronitrile) (AIBN), dimethyl 2,2'-azo-bis(isobutyrate), 1,1'-azo-bis(cyclohexane-1-carbonitrile), 2,2'-azo-bis(2-methylbutyronitrile), 2,2'-azo-bis(2,4-dimethylvaleronitrile), azo-bis(isocapronitrile) and azo-bis(isovaleronitrile); benzoyl peroxide (BPO); lauryl peroxide; and tert-butyl hydroperoxide.

The polymerization reaction includes mass polymerization, solution polymerization, suspension polymerization, mass-suspension polymerization and emulsion polymerization. Examples of suitable solvent for solid polymerization may include at least one selected from the group consisting of benzene, toluene, xylene, halogenated benzene, diethyl ether, tetrahydrofuran, 1,4-dioxane, acetates, esters, lactones, ketones, and amides.

The polymerization temperature of the polymers represented by the formula 1 is properly controllable depending on the type of the polymerization initiator. For example, the polymerization temperature is preferably in the range from 60 to 80° C. in the presence of azo-bis(isobutyronitrile) used as a polymerization initiator.

The molecular weight and the molecular weight distribution of the polymers are also properly controllable depending on the added amount of the polymerization initiator and the polymerization temperature and time.

Preferably, non-reactive monomers and by-products remaining in the reaction mixture after the completion of the polymerization reaction are removed by the precipitation method using an appropriate solvent. The precipitating solvent can be selected depending on the type of the polymerizing solvent and the structure of the monomer used. Specific examples of the suitable precipitating solvent may include methanol, a mixed solvent of methanol and distilled water, ethanol, isopropylalcohol, a mixed solvent of isopropylalcohol and hexane, hexane, and ether.

The polymers represented by the formula 1 have a polystyrene-reduced weight average molecular weight (hereinafter, referred to as "Mw") measured by gel permeation chromatography (GPC) in the range of 1,000 to 100,000, and preferably 3,000 to 50,000 in consideration of sensitivity, developing and coating properties, and heat resistance of the resulting photoresist.

The polymers whose Mw is smaller than 1,000 are hard of forming coatings on the substrate with a deterioration of coating and developing properties, and those having a Mw larger than 100,000 reduce the sensitivity, resolution and developing property of the resist. The molecular weight distribution of the polymers is preferably in the range from 1.0 to 5.0 and, more preferably, from 1.0 to 3.0.

The polymers synthesized were determined in regard to molecular weight (Mw) and molecular weight distribution by gel permeation chromatography using an 1100 series instrument (supplied by HP) and a TriSEC detector (supplied by Viscotek) equipped with one G2500HXL column and one G4000HXL column in tetrahydrofuran (as an eluant) at 40° C. and at a flow rate of 1.0 ml/min. The molecular weight values reported are reduced in relation to a monodispersion polystyrene standard.

The polymers can be used alone or in combination of two or more of them in the resist composition of the invention.

(B) Photoacid Generator

Examples of suitable photoacid generator for the composition of the present invention may include onium salts such as iodonium salt, sulfonium salt, phosphonium salt, diazonium salt and pyridinium salt and, particularly preferably, triphenylsulfonium triplate, diphenyl(4-methylphenyl) sulfonium triplate, diphenyl(4-t-butylphenyl)sulfonium triplate, diphenyl(4-methoxyphenyl)sulfonium triplate, diphenyl(naphthyl)sulfonium triplate, dialkyl(naphthyl) sulfonium triplate, triphenylsulfonium nonaplate, diphenyl (4-methylphenyl)sulfonium nonaplate, diphenyl(4-t-butylphenyl)sulfonium nonaplate, diphenyl(4-methoxyphenyl)sulfonium nonaplate, diphenyl(naphthyl) sulfonium nonaplate, dialkyl(naphthyl)sulfonium nonaplate, triphenylsulfonium hexafluoroantimonate, diphenyliodonium triplate, diphenyliodonium methylbenzene sulfonate, bis(cyclohexylsulfonyl)diazomethane, and bis(2,4-dimethylphenylsulfonyl)diazomethane.

Unlike the related art photoacid generators, the onium salts represented by the formula 3 acts as a dissolution inhibitor in the exposed region of the resist and a dissolution enhancer in the exposed region, thereby making the exposed region dissolved more readily than the unexposed one.

[Formula 3]

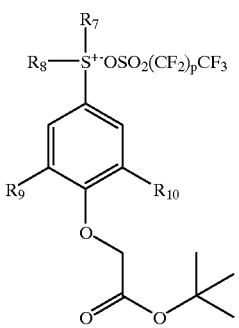

(PAG I)

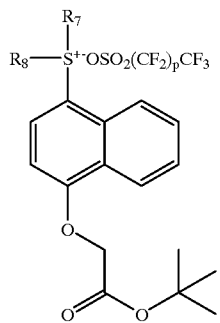

(PAG II)

wherein $R_7$ and $R_8$ are independently a normal, branched, monocyclic or polycyclic alkyl group, or an aryl group; $R_9$ and $R_{10}$ are independently hydrogen, an alkyl group, or an alkoxyl group; and p is an integer from 0 to 14.

An amount of the photoacid generator contained in the resist composition of the present invention is in the range of 0.1 to 30 parts by weight and preferably 0.3 to 10 parts by weight based on 100 parts by weight of the polymer. Those photoacid generators can be used alone or in combination of two or more of them in the resist composition of the invention.

(C) Low Molecular Weight Additives

The low molecular weight additives used in the present invention provide such a ring structure in the molecule as to increase the dry etching resistance, improve the residual coating property at the unexposed region and promote dissolution in an alkaline developing solution by the action of the acid at the exposed region, thereby much enhancing dissolution contrast in the development step and verticality of the side walls of the resist pattern.

Alicyclic derivatives with an acid-labile leaving group are particularly suitable as a compound readily decomposable to acids to promote the dissolution rate in the developing solution.

The low molecular weight additives used in the present invention are carboxylic acid derivatives represented by the formula 2.

Special examples of the carboxylic acid derivatives having the formula 2 may include:

(V-1)

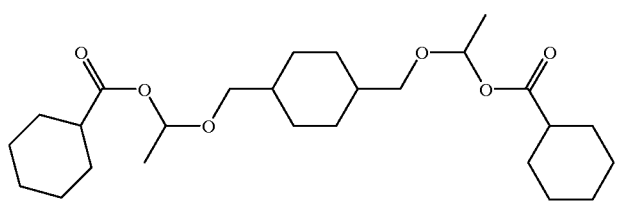

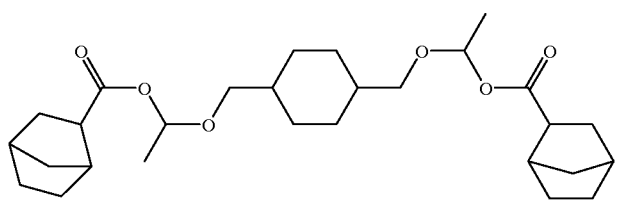
(V-2)
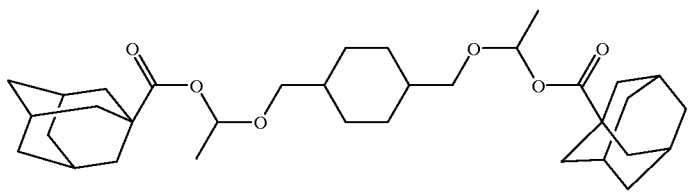
(V-3)
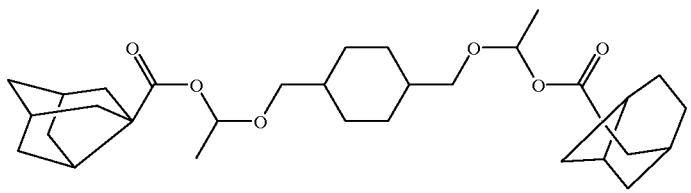
(V-4)
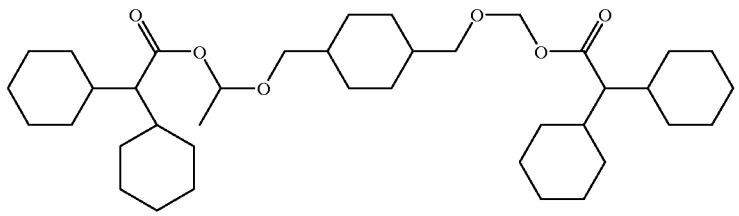
(V-5)
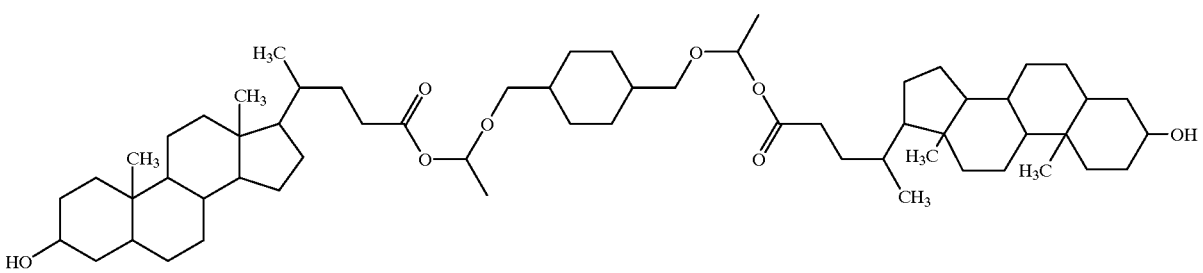
(V-6)
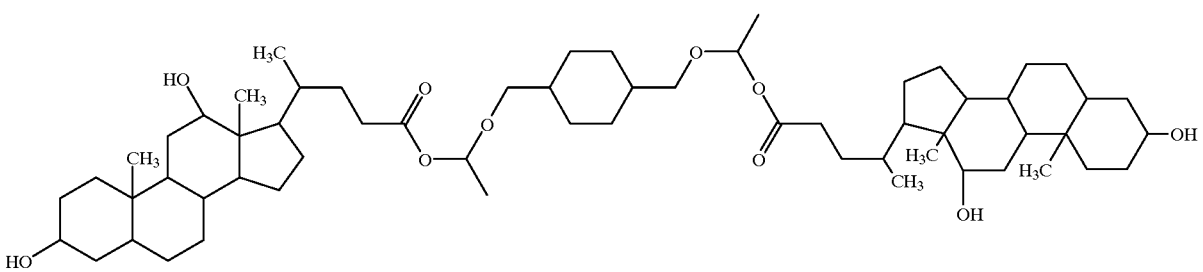
(V-7)

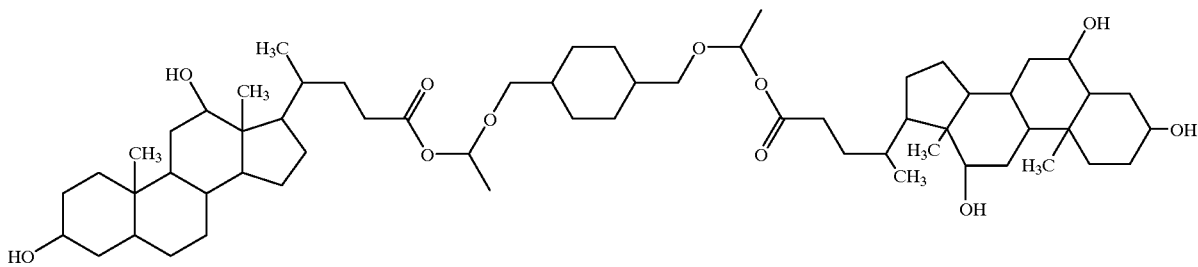
(V-8)

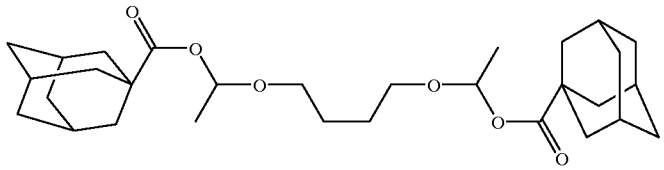
(V-9)

These low molecular weight additives can be used alone or in combination of two or more of them in the resist composition of the invention.

An amount of the low molecular weight additives contained in the resist composition of the invention is in the range of 3 to 50 parts by weight and preferably 5 to 40 parts by weight based on 100 parts by weight of the polymer. The low molecular weight additives in an amount of less than 3 parts by weight hardly act on the resist. With an amount of the low molecular weight additives exceeding 50 parts by weight, the resulting resist will have a great deterioration of adhesion to the substrate and coating property.

The resist composition of the invention may optionally contain other additives. For example, these optional additives include surfactant, halation inhibitor, adhesion promoter, storage stabilizer and antifoaming agent.

Specific examples of suitable surfactant are polyoxylauryl ether, polyoxystearyl ether, polyoxyethylene oleyl ether, and polyethylene glycol dilaurylate. An amount of the surfactant contained in the resist composition of the invention is preferably less than 2 parts by weight based on 100 parts by weight of the polymer.

Also, the resist composition of the invention may optionally contain a basic compound in order to prevent diffusion of acids generated under irradiation of a radiation. An amount of the basic compound contained in the resist composition of the invention is preferably in the range of 0.01 to 5 parts by weight based on 100 parts by weight of the polymer. If the amount of the basic compound exceeds the above range, diffusion of the acids decreases with a deterioration of sensitivity of the resist.

Preferably, the resist composition of the invention is dissolved in a solvent having appropriate vaporization rate and viscosity prior to use in order to obtain a uniform and smooth coating film.

Examples of suitable solvent may include ethylene glycol monomethyl ether, ethylene glycol monoethyl ether, ethylene glycol monopropyl ether, methylcellusolve acetate, ethylcellusolve acetate, propylene glycol monomethyl ether acetate, propylene glycol monoethyl ether acetate, propylene glycol monopropyl ether acetate, methyl ethyl ketone, cyclohexanone, methyl 2-hydroxypropionate, ethyl 2-hydroxypropionate, 2-heptanone, ethyl lactate, and γ-butyrolactone. These solvents can be used alone or in combination of two or more of them in the resist composition of the invention. The amount of the solvent used in the resist composition is properly controllable depending on the properties of the solvent, i.e., volatility and viscosity so as to form a uniform resist film on a wafer.

The resist composition of the invention is prepared in the form of a solution, applied to the wafer substrate and dried to form a resist film. In applying the composition on the wafer, the resist solution is filtered and applied to the substrate by a spin coating, flow coating, roll coating or the like.

Subsequently, the resist film is partially subjected to radiations in order to form fine resist patterns. Examples of suitable radiations may include, if not limited to, UV radiations (e.g., i-lines), far UV radiations (e.g., KrF excimer laser and ArF excimer laser), X-rays, and charged particle rays (e.g., electron rays). The radiations can be selected depending on the type of the photoacid generator. Following the irradiation of radiations, the resist film is optionally subjected to heat treatment in order to enhance the sensitivity.

In the subsequent development step, the irradiated resist film is developed with a developing solution, examples of which may include aqueous solutions containing sodium hydroxide, potassium hydroxide, sodium carbonate, sodium silicate, sodium methasilicate, ammonia water, ethyl amine, n-propyl amine, triethylamine, tetramethylammonium hydroxide, or tetraethylammonium hydroxide. Among these developing solutions, tetramethylammonium hydroxide is most preferable. Optionally, the developing solution further contains additives such as surfactant or aqueous alcohols.

The present invention will be described in greater detail by way of the following examples, which are not intended to limit the present invention.

SYNTHESIS EXAMPLES OF MONOMER AND LOW MOLECULAR WEIGHT COMPOUND

Synthesis Example 1

50 g of a Zn—Cu couple and 90 ml of tetrahydrofuran were added to a four-necked round bottom flask equipped with an agitator and a reflux condenser. To the mixture was then slowly added a solution prepared by mixing 53 ml of tert-butylbromoacetate with 36 ml of 5-norbornene-2-carboxaldehyde in 180 ml of tetrahydrofuran. The mixed solution was refluxed at 70° C. for 2 hours and cooled to the room temperature. After removal of the Zn—Cu couple, the resulting solution was extracted/washed and distilled under vacuum to yield 39 g of a desired monomer, 3-bicyclo[2,2,1]hept-5-en-2-yl-3-hydroxy-propionic acid-tert-butylester (hereinafter, referred to as "BHP"; M-I).

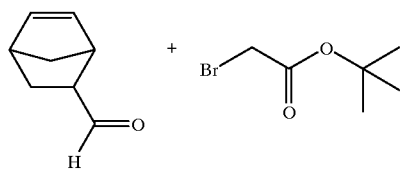

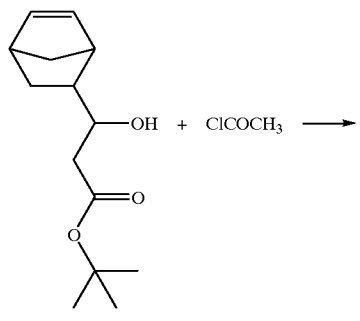

Synthesis Example 2

50 g of BHP was dissolved in methylene chloride and 20 g of acetyl chloride was added to the solution at a reduced temperature of 0° C., followed by slowly adding 32 g of triethylaminee as a catalyst. The reaction mixture was stirred at the same temperature for 1 hour and removed of the solvent by distillation under vacuum. The resulting reaction mixture was diluted with ether and then washed with distilled water, an aqueous sodium carbonate solution and saline water. After removal of the organic layer, the aqueous layer was dried with magnesium sulfate and completely removed of the solvent to yield 57 g of a desired monomer (M-II).

Synthesis Example 3

The same procedure as described in Synthesis Example 2 was performed excepting that 37 g of cyclohexane carbonyl chloride was used instead of 20 g of acetyl chloride, to yield 66 g of a desired monomer (M-III).

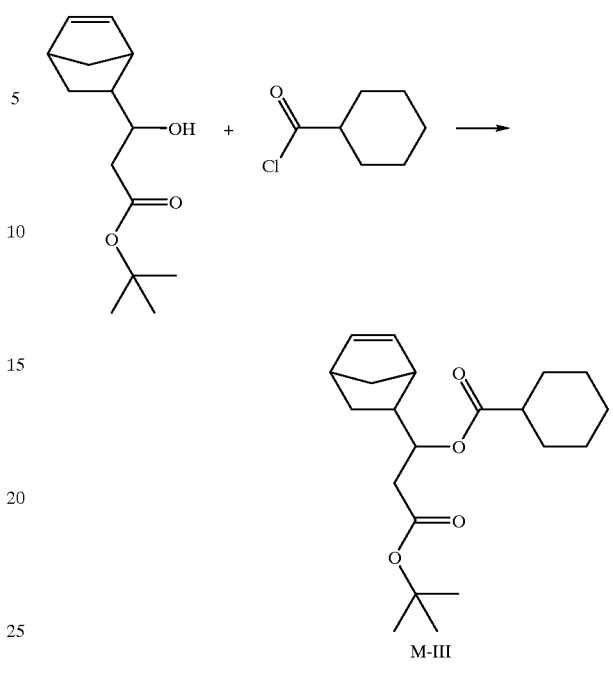

Synthesis Example 4

30 g of norbornene carboxylic acid was dissolved in methylene chloride and 21 g of chloromethyl methyl ether was added to the solution at a reduced temperature of 0° C., followed by slowly adding 28 g of triethylamine as a basic catalyst. The reaction mixture was stirred at the same temperature for 1 hour and removed of the solvent by distillation under vacuum. The resulting reaction mixture was diluted with ether and then washed with distilled water, an aqueous sodium carbonate solution and saline water. After removal of the organic layer, the aqueous layer was dried with magnesium sulfate and completely removed of the solvent to yield 35 g of a desired monomer (M-IV).

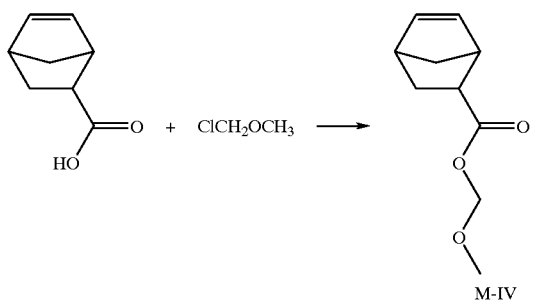

Synthesis Example 5

67 g of 5-norbornene-2,3-dicarboxylic anhydride and 50 g of diphenyl aminopyridine were dissolved in 154 ml of t-butanol. After 24 hours of stirring at 80° C., the reaction mixture was subjected to precipitation/filtration with an excess of 5% aqueous HCl solution and dried under vacuum to yield 62 g of bicyclo[2,2,1]-5-heptene-2,3-dicarboxylic acid-mono-tert-butylester.

Subsequently, the same procedure as described in Synthesis Example 4 was performed excepting that 52 g of bicyclo[2,2,1]-5-heptene-2,3-dicarboxylic acid-mono-tert-butyl ester was used instead of 30 g of norbornene carboxylic acid, to yield 51 g of a desired monomer (M-V).

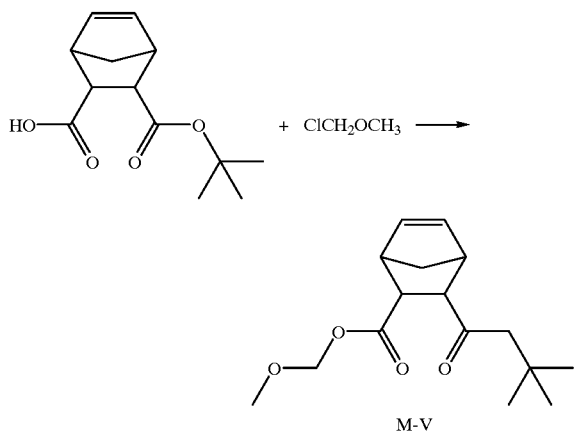

M-V

Synthesis Example 6

12.8 g of cyclohexane carboxylic acid and 0.5 g of pyridinium p-toluene sulfonate were dissolved in methylene chloride, and 11.8 g of cyclohexane dimethanol divinyl ether was slowly added at a reduced temperature of 0° C. The reaction mixture was then stirred at the room temperature for 1 hour. The organic layer thus obtained was washed with an aqueous potassium bicarbonate solution and then twice with an excess of distilled water. After removal of the organic layer, the aqueous layer was dried with magnesium sulfate and completely removed of the solvent to remain an oil layer, which was then added to an excess of isopropyl alcohol. After filtration, the precipitate thus obtained was dried under vacuum to yield 14.7 g of a low molecular weight additive (Add.-I).

Add.-I

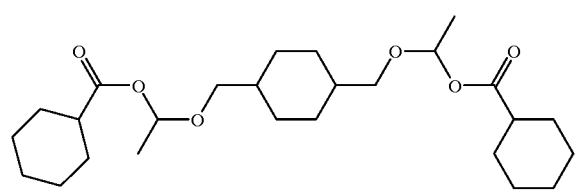

Synthesis Example 7

The same procedure as described in Synthesis Example 6 was performed excepting that 14.0 g of norbornane carboxylic acid was used instead of 12.8 g of cyclohexane carboxylic acid, to yield 15.5 g of a low molecular weight additive (Add.-II).

Add.-II

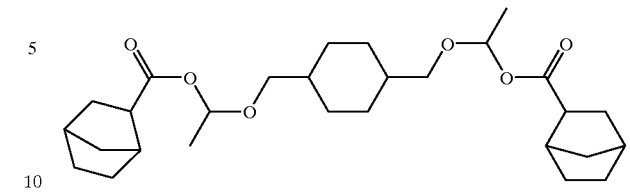

Synthesis Example 8

The same procedure as described in Synthesis Example 6 was performed excepting that 18.0 g of adamanthane carboxylic acid was used instead of 12.8 g of cyclohexane carboxylic acid, to yield 18.1 g of a low molecular weight additive (Add.-III).

Add.-III

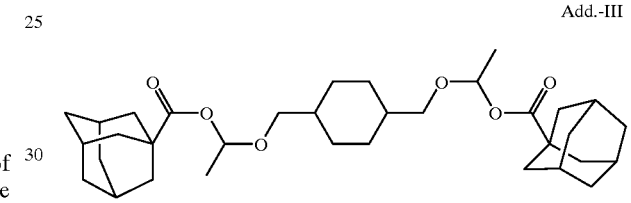

Synthesis Example 9

The same procedure as described in Synthesis Example 6 was performed excepting that 22.4 g of dicyclohexyl acetate was used instead of 12.8 g of cyclohexane carboxylic acid, to yield 21.0 g of a low molecular weight additive (Add.-IV).

Add.-IV

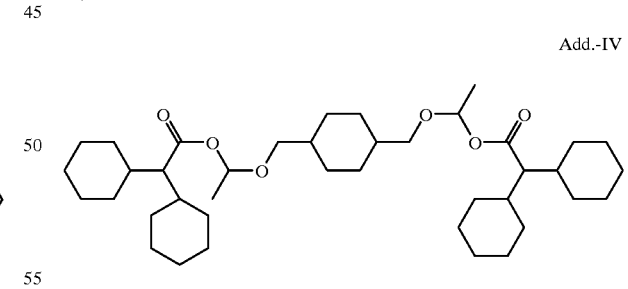

Synthesis Example 10

The same procedure as described in Synthesis Example 6 was performed excepting that 37.7 g of lithocholic acid was used instead of 12.8 g of cyclohexane carboxylic acid and tetrahydrofuran was used instead of methylene chloride, to yield 30.8 g of a low molecular weight additive (Add.-V).

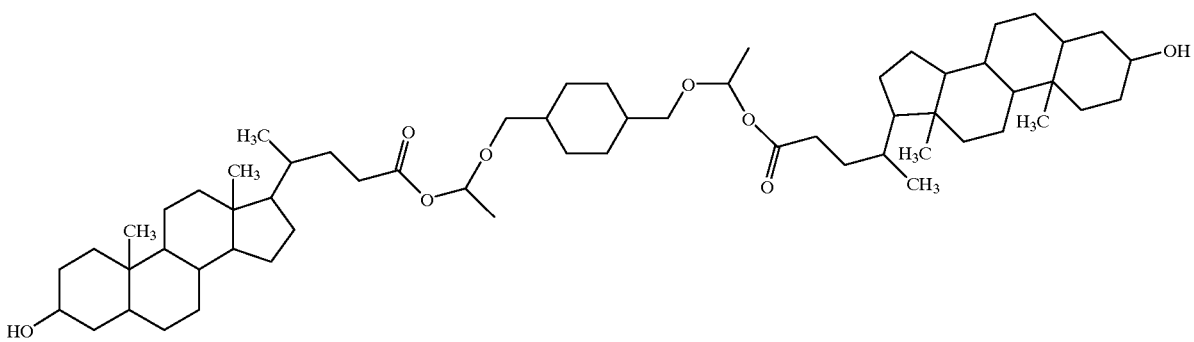

Add.-V

Synthesis Example 11

The same procedure as described in Synthesis Example 10 was performed excepting that 39.3 g of deoxycholic acid was used instead of 37.7 g of lithocholic acid, to yield 31.9 g of a low molecular weight additive (Add.-VI).

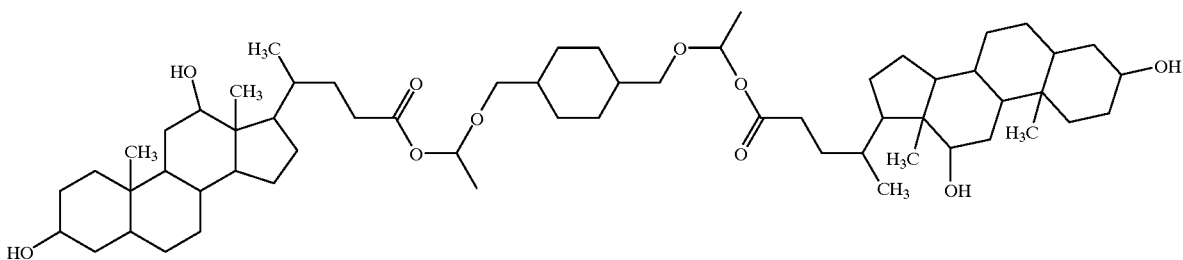

Add. -VI

Synthesis Example 12

The same procedure as described in Synthesis Example 8 was performed excepting that 8.5 g of butane diol divinyl ether was used instead of 11.8 g of cyclohexane dimethanol divinyl ether, to yield 16.3 g of a low molecular weight additive (Add.-VII).

Add.-VII

Synthesis of Polymer

Polymerization Example 1

To a two-necked round bottom flask equipped with an agitator and a reflux condenser were added 7.15 g of monomer M-I (in Synthesis Example 1), 4.90 g of anhydrous maleic acid, 1.88 g of norbornene, 0.82 g of AIBN as a polymerization initiator, and 27.86 g of dioxane as a polymerizing solvent. The reaction mixture was stirred under argon atmosphere at the room temperature for 2 hours. After 20 hours of polymerization reaction at 65° C., the polymerization solution was cooled to the room temperature, diluted with another dioxane and subjected to precipitation/filtration with an excess of a mixed solvent of isopropylalcohol and methanol (5:1). The solution was washed with the precipitating solvent of the same mixing ratio several times and dried under vacuum to obtain 9.05 g of a polymer (P1). The polystyrene-reduced weight average molecular weight of the polymer was 7,800.

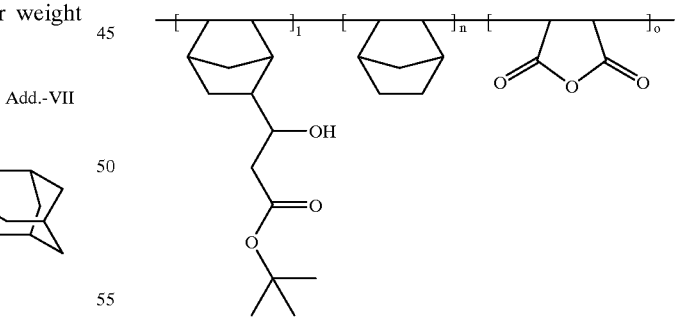

(P1)

Polymerization Example 2

The same procedure as described in Polymerization Example 1 was performed excepting that 3.57 g of monomer M-I (in Synthesis Example 1), 4.21 g of monomer M-II (in Synthesis Example 2), 4.90 g of anhydrous maleic acid, 1.88 g of norbornene, 0.82 g of AIBN as a polymerization initiator, and 29.12 g of dioxane as a polymerizing solvent were used to obtain 8.74 g of a polymer (P2). The polystyrene-reduced weight average molecular weight of the polymer was 8,500.

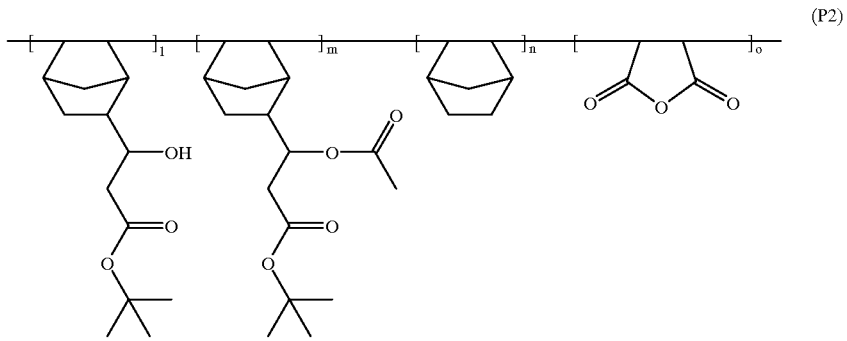

(P2)

Polymerization Example 3

The same procedure as described in Polymerization Example 1 was performed excepting that 3.57 g of monomer M-I (in Synthesis Example 1), 5.23 g of monomer M-III (in Synthesis Example 3), 4.90 g of anhydrous maleic acid, 1.88 g of norbornene, 0.82 g of AIBN as a polymerization initiator, and 31.16 g of dioxane as a polymerizing solvent were used to obtain 8.57 g of a polymer (P3). The polystyrene-reduced weight average molecular weight of the polymer was 8,000.

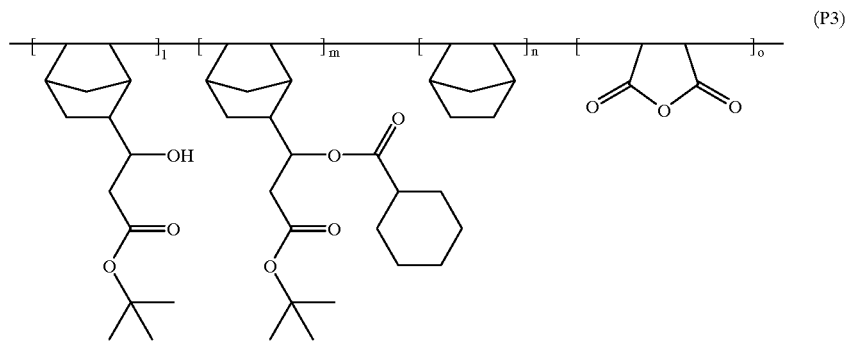

(P3)

Polymerization Example 4

The same procedure as described in Polymerization Example 1 was performed excepting that 3.57 g of monomer M-I (in Synthesis Example 1), 2.73 g of monomer M-IV (in Synthesis Example 4), 4.90 g of anhydrous maleic acid, 1.88 g of norbornene, 0.82 g of AIBN as a polymerization initiator, and 26.16 g of dioxane as a polymerizing solvent were used to obtain 6.54 g of a polymer (P4). The polystyrene-reduced weight average molecular weight of the polymer was 6,500.

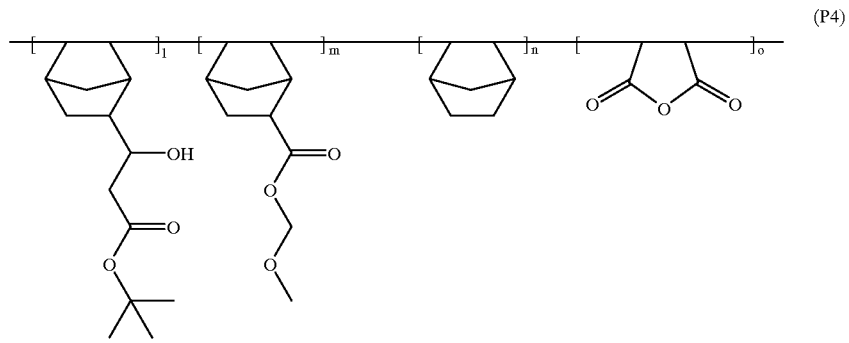

(P4)

Polymerization Example 5

The same procedure as described in Polymerization Example 1 was performed excepting that 3.57 g of monomer M-I (in Synthesis Example 1), 4.23 g of monomer M-V (in Synthesis Example 5), 4.90 g of anhydrous maleic acid, 1.88 g of norbornene, 0.82 g of AIBN as a polymerization initiator, and 29.16 g of dioxane as a polymerizing solvent were used to obtain 7.29 g of a polymer (P5). The polystyrene-reduced weight average molecular weight of the polymer was 7,600.

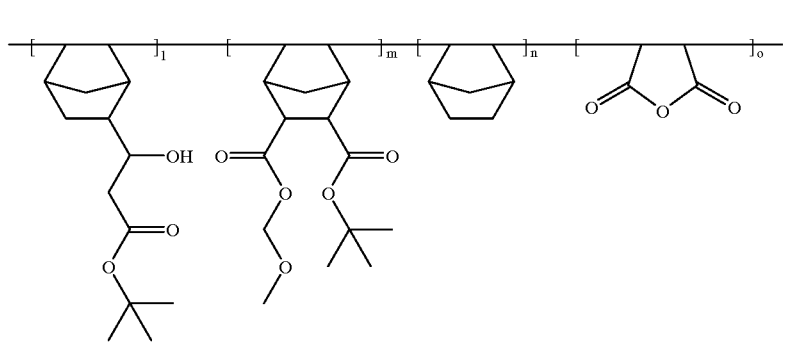

(P5)

Preparation and Evaluation of Resist

Example 1

First, the resist composition of the invention was prepared by dissolving, based on 100 parts by weight of the resin (P1) (in Polymerization Example 1), 1.4 parts by weight of triphenyl sulfonium triplate as a photoacid generator, 0.2 part by weight of tetramethyl ammonium hydroxide as a basic additive and 20 parts by weight of the low molecular weight additive (Add.-I) (in Synthesis Example 6) in 550 parts by weight of propylene glycol methyl ether acetate, and filtering the solution through a filter with approximately 0.2 μm pore size.

The resist solution thus obtained was coated to a substrate with a spinner and dried at 110° C. for 90 seconds to form a 0.41 μm thick coating. This resist coating was irradiated with an ArF excimer laser stepper and baked at 110° C. for 90 seconds. Then, the resist coating was developed with an alkaline aqueous solution containing 2.38 wt. % of tetramethylammonium hydroxide for 60 second. The developed resist coating was washed and dried to form a resist pattern.

The resist pattern thus obtained was excellent in both developing property in the aqueous tetramethylammonium hydroxide solution and adhesion to substrate and measured to have a resolution of 0.14 μm and a sensitivity of 26 mJ/cm².

For the result of Example 1, the optimum exposure dose was determined by measuring the exposure dose of irradiation providing 0.15 μm line-and-space(L/S) pattern in the one-to-one line width after development and designated by sensitivity, at which optimum exposure dose the minimum pattern size was determined as resolution.

Examples 2 to 5

As shown in Table 1, the individual resist compositions were prepared by dissolving the respective resins (P2 to P5) (in Polymerization Examples 2 to 5), photoacid generator, basic additive and low molecular weight additive (Add.-I) (in Synthesis Example 6) in 550 parts by weight of propylene glycol methyl ether acetate, and filtering the solution through a filter with approximately 0.2 μm pore size. In the same manner as described in Example 1, an ArF excimer exposure system (numerical aperture of the lens: 0.60) was used on the resist compositions to form positive resist patterns, which were then evaluated for various properties. The results are presented in Table 1.

Examples 6 to 10

As shown in Table 1, the individual resist compositions were prepared by dissolving the respective resins (P1 to P5) (in Polymerization Examples 1 to 5), photoacid generator, basic additive and low molecular weight additive (Add.-III) (in Synthesis Example 8) in 550 parts by weight of propylene glycol methyl ether acetate, and filtering the solution through a filter with approximately 0.2 μm pore size. In the same manner as described in Example 1, an ArF excimer exposure system (numerical aperture of the lens: 0.60) was used on the resist compositions to form positive resist patterns, which were then evaluated for various properties. The results are presented in Table 1.

Comparative Examples 1 to 5

As show in Table 1, the same procedures as described in Examples 6 to 10 were performed excepting that no low molecular weight additive was used. In the same manner as described in Example 1, an ArF excimer exposure system (numerical aperture of the lens: 0.60) was used on the resist compositions to form positive resist patterns, which were then evaluated for various properties. The results are presented in Table 1.

TABLE 1

| | Resin (Part) | PAG (Part) | Base (Part) | Add. (Part) | Refining Effect | Sensitivity (mJ/cm²) | Resolution (μm) |
|---|---|---|---|---|---|---|---|
| Example 1 | P1 (100) | 1.4 | 0.3 | Add.-I (20) | None | 24 | 0.14 |
| Example 2 | P2 (100) | 1.4 | 0.3 | Add.-I (20) | None | 26 | 0.14 |
| Example 3 | P3 (100) | 1.4 | 0.3 | Add.-I (20) | None | 26 | 0.14 |
| Example 4 | P4 (100) | 1.4 | 0.3 | Add.-I (20) | None | 24 | 0.14 |
| Example 5 | P5 (100) | 1.4 | 0.3 | Add.-I (20) | None | 22 | 0.13 |

TABLE 1-continued

| | Resin (Part) | PAG (Part) | Base (Part) | Add. (Part) | Refining Effect | Sensitivity (mJ/cm$^2$) | Resolution ($\mu$m) |
|---|---|---|---|---|---|---|---|
| Example 6 | P1 (100) | 1.4 | 0.3 | Add.-III (20) | None | 25 | 0.14 |
| Example 7 | P2 (100) | 1.4 | 0.3 | Add.-III (20) | None | 27 | 0.14 |
| Example 8 | P3 (100) | 1.4 | 0.3 | Add.-III (20) | None | 27 | 0.14 |
| Example 9 | P4 (100) | 1.4 | 0.3 | Add.-III (20) | None | 25 | 0.14 |
| Example 10 | P5 (100) | 1.4 | 0.3 | Add.-III (20) | None | 23 | 0.13 |
| Comparative Example 1 | P1 (100) | 1.2 | 0.2 | 0 | Serious | 28 | 0.14 |
| Comparative Example 2 | P2 (100) | 1.2 | 0.2 | 0 | Serious | 30 | 0.15 |
| Comparative Example 3 | P3 (100) | 1.2 | 0.2 | 0 | Serious | 30 | 0.15 |
| Comparative Example 4 | P4 (100) | 1.2 | 0.2 | 0 | Slight | 28 | 0.15 |
| Comparative Example 5 | P5 (100) | 1.2 | 0.2 | 0 | Slight | 26 | 0.14 |

Photoacid Generator (PAG): triphenylsulfonium triplate
Basic Additive (Base): tetramethylammonium hydroxide
Part: Part by weight As is apparent from Table 1, the resist patterns obtained in the Examples and Comparative Examples were excellent in adhesion and developing property as well as heat resistance, i.e., they had no deformation after heated on a hot plate at 130° C.

In particular, the resist compositions using the low molecular weight additive had no refining effect and provided resist patterns with good sectional property.

Examples 11 to 20

As shown in Table 2, the individual resist compositions were prepared by dissolving the respective resins (P1 and P5) (in Polymerization Examples 1 to 8), low molecular weight additive, photoacid generator and basic additive in 550 parts by weight of propylene glycol methyl ether acetate, and filtering the solution through a filter with approximately 0.2 $\mu$m pore size. In the same manner as described in Example 1, an ArF excimer exposure system (numerical aperture of the lens: 0.60) was used on the resist compositions to form positive resist patterns, which were then evaluated for various properties. The results are presented in Table 2.

The dry etching resistance was measured by conducting the dry etching with an IEM type etching system (supplied by Tokyo Electron) under the conditions: pressure of 30 mtorr, Ar flow rate of 400 sccm, $C_4F_8$ flow rate of 11 sccm and $O_2$ flow rate of 8 sccm for 120 seconds and presented as a value relative to the etching rate of the resist for Novolak i-line.

Comparative Examples 6 and 7

As show in Table 2, the same procedures as described in Examples 11 to 20 were performed excepting that no low molecular weight additive was used. In the same manner as described in Example 1, an ArF excimer exposure system (numerical aperture of the lens: 0.60) was used on the resist compositions to form positive resist patterns, which were then evaluated for various properties. The results are presented in Table 2.

TABLE 2

| | Resin (Part) | PAG (Part) | Base (Part) | Add. (Part) | Sensitivity (mJ/cm$^2$) | Resolution ($\mu$m) | Dry Etching Resistance |
|---|---|---|---|---|---|---|---|
| Example 11 | P1 (100) | 1.4 | 0.3 | Add.-I (20) | 24 | 0.14 | 1.30 |
| Example 12 | P1 (100) | 1.4 | 0.3 | Add.-II (20) | 24 | 0.14 | 1.28 |
| Example 13 | P1 (100) | 1.4 | 0.3 | Add.-III (20) | 25 | 0.14 | 1.22 |
| Example 14 | P1 (100) | 1.4 | 0.3 | Add.-IV (20) | 26 | 0.14 | 1.24 |
| Example 15 | P1 (100) | 1.4 | 0.3 | Add.-V (20) | 26 | 0.15 | 1.20 |
| Example 16 | P5 (100) | 1.4 | 0.3 | Add.-I (20) | 24 | 0.13 | 1.31 |
| Example 17 | P5 (100) | 1.4 | 0.3 | Add.-II (20) | 24 | 0.13 | 1.29 |
| Example 18 | P5 (100) | 1.4 | 0.3 | Add.-III (20) | 23 | 0.13 | 1.22 |
| Example 19 | P5 (100) | 1.4 | 0.3 | Add.-IV (20) | 25 | 0.14 | 1.24 |
| Example 20 | P5 (100) | 1.4 | 0.3 | Add.-V (20) | 25 | 0.14 | 1.19 |
| Comparative Example 6 | P1 (100) | 1.2 | 0.2 | 0 | 28 | 0.14 | 1.35 |
| Comparative Example 7 | P5 (100) | 1.2 | 0.2 | 0 | 26 | 0.15 | 1.36 |
| Resist for KrF Excimer Laser (Using PVP Resin) | | | | | | | 1.34 |
| Photoresist for I-line (Using Novolak Resin) | | | | | | | 1.00 |

Photoacid Generator (PAG): triphenylsulfonium triplate
Basic Additive (Base): tetramethylammonium hydroxide
Part: Party by weight As described above, the low molecular weight additive for chemically amplified resist provided by the present invention has good compatibility with other normal resins and high transparency to radiations as well as thermal stability in the range of temperature used in processing the resist. The low molecular weight additive is readily decomposed by the action of the acids generated under exposure, generating 2 equivalent weights of carboxyl acids per one equivalent weight of the low molecular weight additives to enhance sensitivity and dissolution rate. Particularly, the additive has a structure containing a monocyclic or polycyclic alkyl group that increases dry etching resistance. A resist composition comprising the additive may provide a resist pattern excellent in sensitivity as well as adhesion to substrate and dry etching resistance. Such a resist composition is a promising material greatly suitable for use in the fabrication of semiconductor devices that are expected to have further fineness. Especially, the resist composition is suitable for KrF or ArF excimer laser lithography and thus useful in the fine engineering of less than 0.20 micron patterns.

It is to be noted that like reference numerals denote the same components in the drawings, and a detailed description of generally known function and structure of the present invention will be avoided lest it should obscure the subject matter of the present invention.

What is claimed is:

1. A chemically amplified positive photoresist composition comprising:
   a multi-component copolymer represented by the formula 1 and having a polystyrene-reduced weight average molecular weight (Mw) of 3,000 to 50,000 and a molecular weight distribution (Mw/Mn) of 1.0 to 3.0;
   a low molecular weight additive represented by the formula V;

an acid generator; and
a solvent,

[Formula 1]

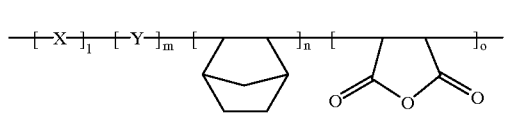

wherein X and Y independently comprise a repeating unit selected from the group consisting of monomers represented by the formulas (II), (III) and (IV):

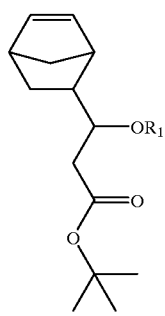 (II)

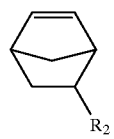 (III)

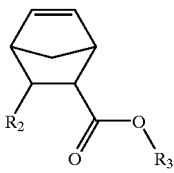 (IV)

wherein $R_1$ is a hydrogen atom, a normal, branched, monocyclic or polycyclic alkyl group having 1 to 20 carbon atoms, or a normal, branched, monocyclic or polycyclic alkyl carbonyl group having 1 to 20 carbon atoms, including acetyl group, t-butyl oxycarbonyl group, cyclohexane carbonyl group, adamanthane carbonyl group and bicyclo[2,2,1]heptane methyl carbonyl group; $R_2$ is a hydrogen atom, a hydroxyl group, a carboxyl group, an alkyl or alkoxy group having 1 to 20 carbon atoms, an alkyl or alkoxy group containing a hydroxyl or carboxyl group, a normal or branched alkyloxycarbonyl or alkoxyalkylcarbonyl group, or a monocyclic or polycyclic alkyloxycarbonyl group; $R_3$ is a hydrogen atom, or a normal, branched, monocyclic or polycyclic alkyl group having 1 to 20 carbon atoms, including methyl group, ethyl group, t-butyl group, isopropyl group, adamanthyl group, and bicyclo[2,2,1] heptane methyl group; and l, m, n and o are independently a number representing the repeating unit of the polymer and satisfying $0 \leq l/(l+m+n+o) \leq 0.5$, $0 \leq m/(l+m+n+o) \leq 0.5$, $0 \leq n/(l+m+n+o) \leq 0.35$, $0.4 \leq o/(l+m+n+o) \leq 0.6$, and $0.15 \leq (l+m)/(l+m+n+o) \leq 0.5$,

[Formula 2]

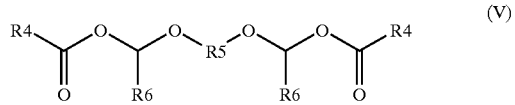 (V)

wherein $R_4$ and $R_5$ are the same as or different from each other and each represents a normal, branched, monocyclic or polycyclic alkyl group having 1 to 20 carbon atoms; and $R_6$ is a hydrogen atom, or a normal, branched, monocyclic or polycyclic alkyl or alkoxy group having 1 to 20 carbon atoms.

2. The chemically amplified positive photoresist composition as claimed in claim 1, wherein the photoresist composition comprises 100 parts by weight of a multicomponent copolymer represented by the formula 1; 5 to 50 parts by weight of a low molecular weight additive represented by the formula V; 0.3 to 10 parts by weight of an acid generator; and a solvent.

3. The chemically amplified positive photoresist composition as claimed in claim 1 or 2, wherein the photoresist composition comprises less than 50 parts by weight of a basic additive based on 100 parts by weight of an acid generator.

* * * * *